United States Patent [19]
Fordyce

[11] Patent Number: 5,910,746
[45] Date of Patent: Jun. 8, 1999

[54] GATE DRIVE FOR A POWER SWITCHING DEVICE

[75] Inventor: Graham Thomas Fordyce, Rockford, Ill.

[73] Assignee: Sundstrand Corporation, Rockford, Ill.

[21] Appl. No.: 08/037,767

[22] Filed: Mar. 26, 1993

[51] Int. Cl.$^6$ .............................................. H03K 17/687
[52] U.S. Cl. .......................... 327/379; 327/433; 327/478
[58] Field of Search ................................. 307/263, 296.1, 307/296.4, 570, 572, 630, 631, 633, 634, 639, 640, 642, 638; 327/134, 379, 388, 389, 433, 438, 440, 465, 478, 530, 531, 544, 545

[56] References Cited

U.S. PATENT DOCUMENTS

| | | | |
|---|---|---|---|
| 3,697,783 | 10/1972 | Seager | 307/300 |
| 4,100,435 | 7/1978 | Komuro | 307/644 |
| 4,210,826 | 7/1980 | Baker | 307/254 |
| 4,231,083 | 10/1980 | Matsuda et al. | 307/633 |
| 4,292,550 | 9/1981 | Onda et al. | 307/640 |
| 4,423,341 | 12/1983 | Shelly | 307/570 |
| 4,597,038 | 6/1986 | Stacey | 307/633 |
| 4,654,544 | 3/1987 | Wheeler | 307/270 |
| 4,721,869 | 1/1988 | Okado | 307/570 |
| 4,725,741 | 2/1988 | Shekhawat et al. | 307/315 |
| 4,728,817 | 3/1988 | Jessee et al. | 307/270 |
| 4,767,952 | 8/1988 | Nollet | 307/571 |
| 4,906,876 | 3/1990 | Landseadel | 307/570 |
| 4,924,122 | 5/1990 | Harris | 307/570 |
| 4,947,055 | 8/1990 | Shekhawat et al. | 307/254 |
| 5,045,734 | 9/1991 | Mehl | 307/570 |
| 5,055,722 | 10/1991 | Latos et al. | 307/570 |
| 5,272,398 | 12/1993 | Schroder-Brumloop et al. | 307/296.4 |

FOREIGN PATENT DOCUMENTS 60-244120  6/1985  Japan .

Primary Examiner—Terry D. Cunningham
Attorney, Agent, or Firm—Marshall, O'Toole, Gerstein, Murray & Borun

[57] ABSTRACT

A drive circuit for a voltage controlled power switching device includes a transformer, a full-wave rectifier bridge coupled to the transformer, first and second capacitors connected in series between nodes of the full-wave rectifier bridge and first and second controlled switches coupled between a control electrode of the power switching device and the first and second capacitors, respectively, wherein each controlled switch has a control electrode coupled to a secondary winding of the trans-former. Current is provided by the first capacitor to the control electrode of the power switching device through the first controlled switch at the beginning of a negative pulse appearing at the secondary winding of the transformer and charging current is provided to the first capacitor from the secondary winding of the transformer through the full-wave rectifier bridge after the beginning of the negative secondary pulse. Current is drawn from the control electrode of the power switching device through the second controlled switch to the second capacitor at the beginning of a positive pulse appearing across the secondary winding and charging current is provided to the second capacitor from the secondary winding of the transformer through the full-wave rectifier bridge after the beginning of the positive pulse.

14 Claims, 4 Drawing Sheets

GATE DRIVE FOR A POWER SWITCHING DEVICE

TECHNICAL FIELD

The present invention relates generally to device drivers, and more particularly to a gate drive for a power switching device.

BACKGROUND ART

There are numerous applications in which it is necessary to rapidly turn on and turn off high-current capacity power switches to control the power delivered to a load. For example, in an inverter operated in a pulse-width modulated mode of operation, it may be necessary to cycle power switches carrying a high magnitude of current at a high switching frequency. Typically, although not necessarily, these power switches comprise insulated gate bipolar transistors (IGBT's). A gate drive for an IGBT provides the high-current pulses required to turn the IGBT on and off and also provides electrical isolation between the IGBT and control circuits. The electrical isolation can be achieved through the use of an optocoupler or a transformer. A drive circuit using a transformer has the advantage that power can be conveyed across the transformer to operate the IGBT. In contrast, optically based designs typically require a local power source for each IGBT to be controlled.

Nollet, U.S. Pat. No. 4,767,952 discloses a high-speed control circuit for power field effect transistors. Control signals are transmitted via a transformer to drive circuitry. The drive circuitry includes rectifiers for half-wave rectifying the control pulses and a pair of parallel-connected capacitors coupled to the rectifiers. Control electrodes of a pair of power transistors are coupled to the secondary winding of the transformer. The sources of the power transistors are in turn coupled to a control electrode of an output transistor. When a pulse is developed across the secondary winding of the transformer, one of the power transistors is immediately turned on and current is either supplied to or removed from the control electrode of the output transistor by one of the capacitors. The capacitor is recharged during a subsequent portion of the pulse so that the local power supply is restored.

Other patents disclosing drive circuitry for power switches include Seager, U.S. Pat. No. 3,697,783; Inami, et al., U.S. Pat. No. 3,971,961; Baker, U.S. Pat. No. 4,210,826; Carlsen II, U.S. Pat. No. 4,234,805; Akamatsu, U.S. Pat. No. 4,239,988; Coates, U.S. Pat. No. 4,259,939; Shelly, U.S. Pat. No. 4,423,341; Stefani, U.S. Pat. No. 4,636,713; Wheeler, U.S. Pat. No. 4,654,544; Okado, U.S. Pat. No. 4,721,869; Shekhawat, et al., U.S. Pat. No. 4,725,741; Jessee, et al., U.S. Pat. 4,728,817; Shekhawat, et al., U.S. Pat. No. 4,947,055 and Japanese Patent Publication No. 60-244120.

SUMMARY OF THE INVENTION

A drive circuit for a power switching device provides full isolation between input and output yet does not require a local power source for each switch.

More particularly, according to one aspect of the present invention, a drive circuit for a power switching device includes a transformer having a primary winding and a secondary winding across which positive and negative secondary pulses are developed when positive and negative input pulses are provided to the primary winding, a full-wave rectifier bridge having first and second nodes coupled to the secondary winding and third and fourth nodes across which first and second capacitors are connected in series. First and second controlled switches are coupled between a control electrode of the power switching device and the first and second capacitors, respectively, wherein each controlled switch has a control electrode coupled to the secondary winding of the transformer. Current is provided by the first capacitor to the control electrode of the power switching device through the first controlled switch at the beginning of the positive secondary pulse and charging current is provided to the first capacitor from the secondary winding of the transformer through the fullwave rectifier bridge after the beginning of the positive secondary pulse. Current is drawn from the control electrode of the power switching device through the second controlled switch to the second capacitor at the beginning of the negative secondary pulse and charging current is provided to the second capacitor from the secondary winding of the transformer through the full-wave rectifier bridge after the beginning of the negative secondary pulse.

In accordance with the preferred embodiment, means are operable before a particular time at which an input pulse is provided to the primary winding of the transformer for precharging the first capacitor. The precharging means preferably comprises a third controlled switch coupled between a voltage source and the first capacitor.

Also in accordance with the preferred embodiment, the power switching device comprises a power transistor having a main current path electrode receiving a particular voltage developed by the voltage source. The third controlled switch comprises a further transistor having first, second and third electrodes coupled to the main current path electrode of the power transistor, the first capacitor and the control electrodes of the first and second controlled switches, respectively.

The drive circuit may further include first and second zener diodes coupled across the first and second capacitors, respectively. The zener diodes limit first and second capacitor voltages appearing across the first and second capacitors to predetermined levels. Additionally, the second zener diode and the further transistor maintain the power transistor in an off state prior to the particular time.

Still further, a resistor may be coupled between the main current path electrode of the power transistor and the first electrode of the further transistor.

Also in the preferred embodiment, each controlled switch includes first and second main current path electrodes wherein the first main current path electrodes of the first and second controllable switches are coupled to the first and second capacitors, respectively, and the second main current path electrodes are coupled through first and second resistors to the control electrode of the power switching device.

In accordance with another aspect of the present invention, an improvement in a drive circuit for a power switching device wherein the drive circuit includes a transformer having a primary winding and a secondary winding across which a secondary pulse is developed when an input pulse is provided to the primary winding at a particular time, means coupled to the secondary for rectifying the secondary pulse, a capacitor connected to the rectifying means and a controlled switch having a control electrode coupled to the secondary winding of the transformer and main current path electrodes coupled between the capacitor and a control electrode of the power switching device comprises means operable before the particular time for precharging the capacitor.

In accordance with yet another aspect of the present invention, an improvement in a drive circuit for a power transistor having main current path electrodes one of which is coupled to a power source wherein the drive circuit includes a pulse transformer, means coupled to a secondary winding of the pulse transformer for rectifying secondary pulses developed therein, first and second series-connected capacitors connected to the rectifying means and first and second controlled switches each having a control electrode coupled to the secondary winding of the transformer and main current path electrodes coupled between the capacitors and a control electrode of the power transistor comprises means operable before the particular time for precharging the first capacitor including a third controlled switch coupled between the power source and the first capacitor and means coupled between the power transistor and the third controlled switch for detecting an overcurrent condition in the power transistor wherein the third controlled switch is responsive to such overcurrent detection to turn off the power transistor.

The drive circuit of the present invention provides full isolation between a source of control pulses and a power transistor, yet also provides the ability to supply operating power for driving the transistor without the need for a dedicated power source on the secondary side of the transformer. In a power converter having multiple power switches a substantial savings in size and weight can be realized.

DESCRIPTION OF THE PREFERRED EMBODIMENTS

Figure 1:
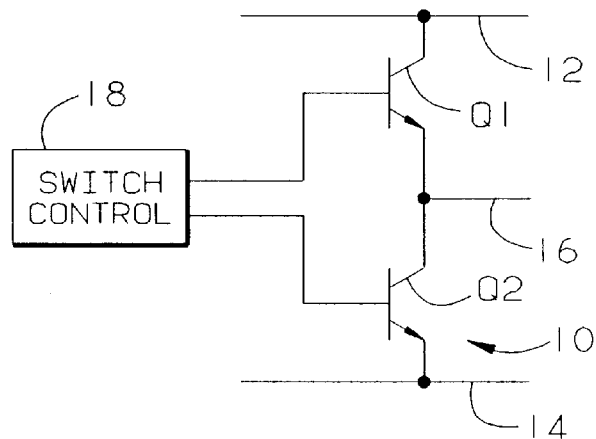
FIG. 1 comprises a combined schematic and block diagram of a switch control in conjunction with an output stage of a power converter.
Figure 2:
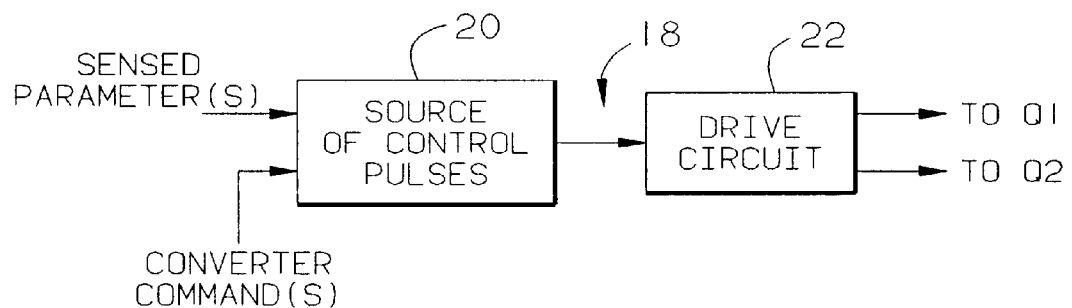
FIG. 2 comprises a block diagram of the switch control of FIG. 1.

Referring now to FIG. 1, a power converter 10 is illustrated as including first and second power switches Q1, Q2 coupled in series across first and second DC conductors or rails 12, 14. The switches Q1 and Q2 are operated to alternately couple the voltages appearing on the rails 12, 14 to a converter output line 16. As should be evident from the foregoing discussion, the converter 10 comprises an inverter which converts DC power into AC power. It should be noted, however, that the power converter 10 may be of a different type, such as a rectifier bridge, a cycloconverter, a switched mode power supply or the like utilizing a controllable power switching device. Also, the present invention is not limited to use with an insulated gate bipolar transistor, but may be used with any other type of voltage controlled power switching device, such as a MOS control thyristor (MCT), or the like. The power switches Q1 and Q2 are operated by a switch control 18 which is shown in greater detail in FIG. 2. A control pulse source 20 is responsive to one or more sensed parameters at a point of regulation as well as a set of converter commands indicating the desired output frequency of the converter 10, the desired output voltage and/or current, and the like and develops control pulses for a drive circuit 22. The drive circuit 22 develops drive signals of appropriate waveshape to operate Q1 and Q2 in the desired manner. The drive circuit 22 may include separate circuits dedicated to operating each of the power switches Q1, Q2 in response to independent control pulses or may include a single drive circuit and appropriate further circuitry to insure that the drive signals for the switches Q1 and Q2 are complementary in nature. Appropriate dwell circuitry may be provided to provide a dwell interval between turn off of one switch and turn on of the other switch to prevent a shoot-through condition, as is conventional. Other circuitry to limit DC content in the output and to provide appropriate phase control of the output of the converter 10 relative to the outputs of other converters and the like may be included in the switch control 18 but are not disclosed herein inasmuch as they form no part of the present invention.

Figure 3:
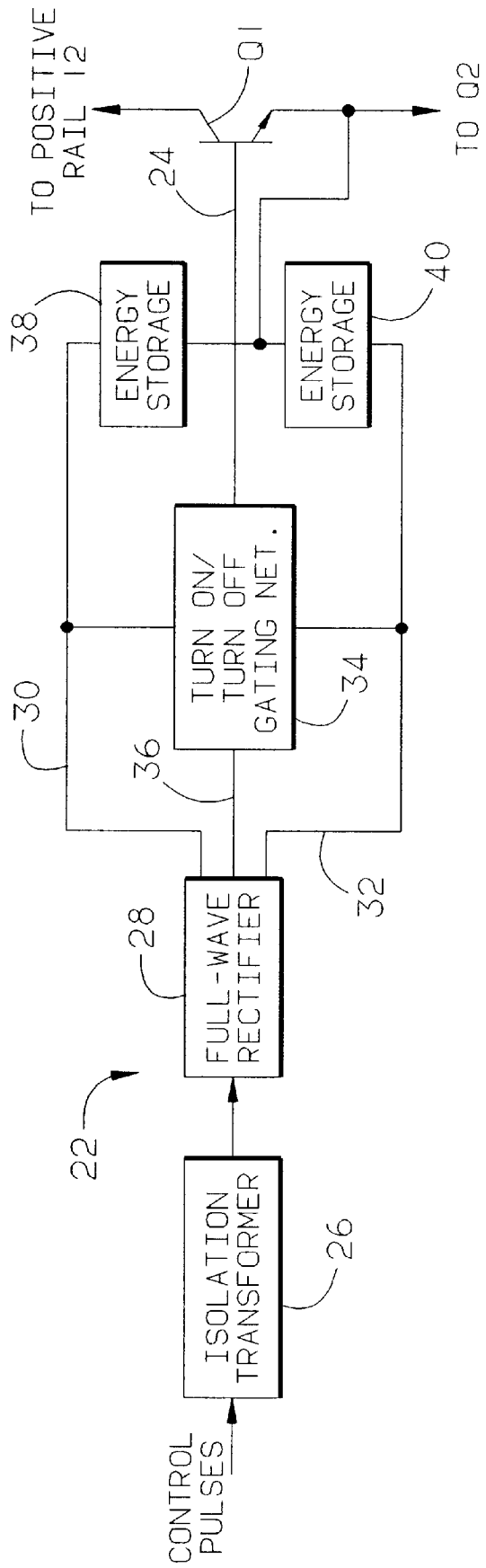
FIG. 3 comprises a block diagram of the drive circuit of FIG. 2.

FIG. 3 illustrates the portion of the drive circuit that drives the transistor Q1 in greater detail, it being assumed that an identical circuit would be provided to drive the transistor Q2. The drive circuit provides a drive signal to a control electrode 24 of the transistor Q1 and includes a pulse transformer 26 which isolates the source 20 from the power transistor Q1. A full-wave rectifier 28 full-wave rectifies the output of the pulse transformer 26 and provides the rectified power on a local power bus comprising conductors 30, 32 which are connected to first and second nodes of the rectifier 28. A turn on/turn off gating network 34 is coupled across the local power bus conductors 30, 32 and, in addition, is connected by a line 36 to a third node of the full-wave rectifier 28. First and second energy storage elements 38, 40 are coupled in series across the local power bus conductors 30, 32 and form a local power supply for the drive circuit 22.

As noted in greater detail hereinafter, the control pulses take the form shown in the bottom waveform of FIG. 5 wherein a negative pulse commands turn on of the power switch Q1 and a positive pulse commands turn off thereof. The control pulses are full-wave rectified and the leading edge of each causes a rapid turn on or turn off gating pulse to be supplied from one of the energy storage elements 38, 40 to the control electrode 24. The energy storage element 38, 40 from which the pulse was supplied is thereafter recharged so that a subsequent turn on/turn off pulse can be developed.

Figure 4:
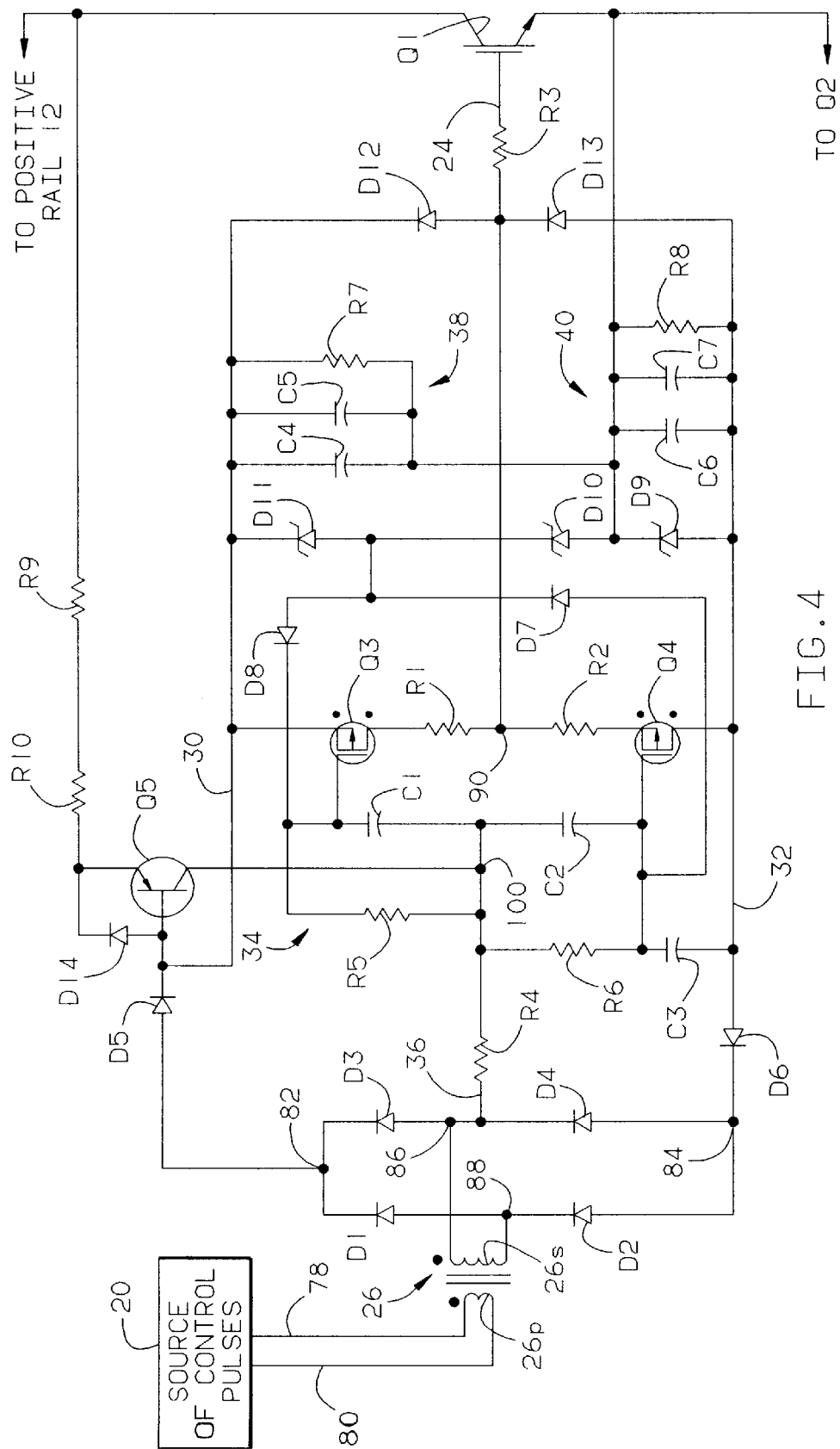
FIG. 4 comprises a schematic diagram of the drive circuit of FIG. 2.

FIG. 4 shows the drive circuit 22 in greater detail. The source of control pulses 20 is coupled by upper and lower lines 78, 80 which are in turn coupled to first and second ends of a primary winding 26p of the transformer 26. A positive pulse on the line 78 represents a command to turn off the transistor Q1 while a positive pulse on the lower line represents a command to turn on the transistor Q1. The combined voltage across the primary winding 26p is shown in FIG. 5 wherein positive pulses comprise turn-off commands and negative pulses comprise turn-on commands.

First through fourth diodes D1–D4 are connected together in a full-wave bridge configuration and include first and second nodes 82, 84, which are coupled by diodes D5, D6 to the local power bus conductors 30, 32. Third and fourth nodes 86, 88, respectively, are coupled across a secondary winding 26s of the pulse transformer 26. The turn on/turn off gating network 34 is coupled across the conductors 30, 32 and includes turn on and turn off transistors Q3, Q4, respectively wherein each transistor Q3, Q4 includes first and second main current path electrodes and a control electrode. The main current path electrodes of the transistors Q3 and Q4 are connected together in series through resistors R1 and R2 across the conductors 30, 32. A junction 90 between the resistors R1 and R2 is connected through a resistor R3 to the control electrode 24 of the power transistor Q1.

The third node of the full-wave rectifier 28 is connected through a resistor R4 and capacitors C1, C2 to the control electrodes of the transistors Q3, Q4. Resistors R5, R6, diodes D7 and D8 and capacitor C3 provide appropriate biasing and voltage limiting of the signals applied to the control electrodes of the transistors Q3 and Q4.

The energy storage elements 38, 40 are illustrated as capacitors C4, C5 and C6, C7, respectively. A resistor R7 is coupled across the capacitors C4 and C5 while a resistor R8 is coupled across the capacitors C6 and C7. The resistors R7 and R8 establish a DC path for correct local supply voltage division. Three zener diodes D9–D11 are coupled across the conductors 30, 32 and limit the voltages across the capacitors C4–C7 to predetermined levels.

The junction 90 is connected through diodes D12 and D13 to the conductors 30, 32, respectively. These diodes prevent the appearance of transient magnitudes greater than the local supply voltage on the gate of the transistor Q1.

Figure 5:
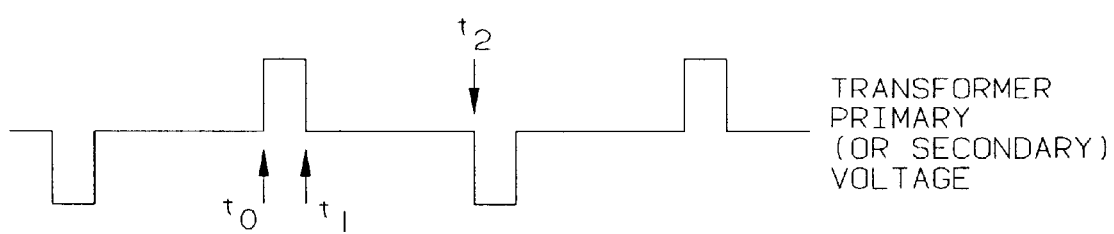
FIG. 5 comprises a waveform diagram of the voltages supplied to the transformer of FIGS. 3 and 4.

When a positive pulse is developed across the primary winding 26p, for example at the time to in FIG. 5, the potential at the node 86 rises and immediately turns on the transistor Q4. Current flows from the control electrode 24 of the transistor Q1 to the capacitors C6 and C7 through the transistor Q4 and the resistors R2 and R3. The turn off current is transferred from the control electrode 24 before the diodes D2 and D3 begin to conduct. At this point and thereafter while the voltage across the secondary winding 26s remains at a substantial positive voltage level (i.e., when the voltage at the node 86 is substantially greater than the voltage at the node 88), charging currents flow to the capacitors C4, Cs, C6, and C7, thereby charging same to the combined zener breakdown voltages of the diodes D9, D10, and D11.

When the voltage across the secondary winding 26s decays to zero following termination of the positive pulse across the primary winding 26p at a time $t_1$, the diodes D2 and D3 cease conduction, and the voltage applied to the control electrodes of the transistors Q3 and Q4 is substantially maintained at a low positive level owing to the control electrode capacitances of these transistors. Thus, the transistor Q4 is latched in the on state while the transistor Q3 is latched in the off state.

At a time $t_2$, a negative pulse is applied to the primary winding 26p. The falling potential appearing at the node 86 causes the transistor Q3 to be quickly turned on and the transistor Q4 to be quickly turned off. Peak drive current flows into the control electrode 24 of the power transistor Q1, via the resistors R1 and R3 and the transistor Q3 from the capacitors C4 and C5. When the voltage across the secondary winding 26s exceeds the voltage across the capacitors C4, C5 and C6, C7 charging currents flow the voltages across the capacitors C4, C5, C6, and C7 are restored to the breakdown voltages of the zener diodes D9–D11.

The resistors R1 and R2 limit the magnitude of shoot through currents caused by simultaneous conduction of the transistors Q3 and Q4 at the moment of switch over, and in conjunction with the resistor R3, control the gate current to/from the transistor Q1. This, in turn, reduces the power consumption of the drive circuit, allowing smaller values of C4–C7.

As the foregoing discussion demonstrates, no attempt is made to supply the short high current control electrode charge and discharge pulses directly through the pulse transformer 26. Thus, the pulse transformer can have significant leakage inductance without performance degradation. Because leakage inductance is no longer a critical consideration, the primary and secondary windings 26p, 26s can be physically separated yielding good isolation and low coupling capacitance essential to eradicate noise problems. The circuit is thus capable of very high speed performance with high noise immunity.

While the drive circuit is capable of latching the transistors Q3 and Q4 in their respective on and off states between successive positive and negative drive pulses, it should be noted that this latching cannot be indefinitely maintained and, if the spacing between the positive and negative drive pulses becomes great enough, the latching action could fail, resulting in failure of the local power supply established by the capacitors C4–C7. In addition, upon start up of the power converter 10, the first pulse must not only drive the transistor Q1 to a desired state but must also charge the capacitors C4–C7, resulting in very slow initial turn on of the transistor Q1. In order to overcome the foregoing problems, and to ensure that the power transistor Q1 is maintained in an off state prior to the first positive on pulse across the primary winding 26p, a precharging circuit comprising a pair of resistors R9, R10, a transistor Q5 and a diode D14 is coupled between the positive rail 12, the conductor 30 and a junction 100 between the control electrodes of the transistors Q3 and Q4. When the transistor Q1 is off and positive voltage is present on the rail 12, there will be a high collector-to-emitter voltage across the transistor Q1 and the transistor Q5 will turn on, causing current flow through the resistors R9 and R10 and the emitter-base junction of the transistor Q5 into the conductor 30 and the capacitors C4 and C5. While the transistor Q5 is on, a high potential is applied to the junction 100 and the control electrodes of the transistors of Q3 and Q4. This ensures that the transistor Q3 is turned off and the transistor Q4 is turned on. This ensures, even in the absence of any pulses from the pulse transformer 26, that while there is collector-to-emitter voltage across the transistor Q1, its control electrode will be held by the transistor Q4 to the voltage on the conductor 32. Inasmuch as the capacitors C6 and C7 do not receive any charge from the transistor Q5 before any pulses have been received from the pulse transformer 26, the voltage of the conductor 32 floats near ground potential and is prevented from going positive from the zener diode D9. Thus, the transistor Q1 is maintained in the off state at this time.

Thereafter, when a negative pulse is developed across the primary winding 26p, the negative voltage at the node 86 relative to the node 88 turns on the transistor Q1 causing the emitter voltage thereof to drop to a low value. This effectively reverse biases the base-emitter junction of the transistor Q5 so that it is turned off and held in an off state.

Subsequently, a positive pulse developed across the primary winding 26p causes the transistor Q1 to turn off so that the drain voltage again rises to that on the positive rail 12. The transistor Q5 turns back on, thereby latching the off state of the transistor Q1 and the base current from the transistor Q5 maintains the voltage across the capacitors C4 and C5.

In summary, the addition of the transistor Q5 and the resistors R9 and R10 causes the off state to be latched before a low voltage is developed at the node 86 and when voltage is present on the positive rail 12. It also ensures high speed operation from the very first negative pulse across the secondary winding 26p by pre-establishing the local supply voltage. However, a negative potential on the gate of the transistor Q1 is not realized until a pulse is received from the pulse transformer 26.

The resistors R9 and R10 and the transistor Q5 also serve a protective function. If the emitter current into the transistor Q1 is sufficient to cause the emitter voltage to exceed the voltage on the conductor 30, the transistor Q5 is relatively slowly brought into conduction until the reducing voltage at the control electrode 24 provides positive feedback. Thereafter, shut down of the transistor Q1 is achieved rapidly. In essence, the base to emitter junction of the transistor Q5 acts as a comparator detecting the difference between the voltage on the emitter of the transistor Q1 and the voltage on the conductor 30. During overcurrent conditions, the load current is progressively reduced and then shut down rather than turned off in an abrupt manner. As should be evident from the foregoing, the transistor Q5 is capable of detecting an overcurrent condition and acting to take corrective action should such a condition arise.

The following list specifies the component values for the resistors and capacitors used in the circuit of FIG. 4, along with an identification of the part numbers for the diodes, transistors and integrated circuits used therein. It should be noted that the following values are to be considered examples only and not as limiting the scope of the present invention. (Resistive values are in ohms and capacitive values are in microfarads, except as otherwise noted. Also, the breakdown voltages of the zener diodes are shown in parentheses.)

| Component | Value or Part No. |
|---|---|
| R1 | 10 |
| R2 | 10 |
| R3 | 4.99 |
| R4 | 100 |
| R5 | 100K |
| R6 | 100K |
| R7 | 100K |
| R8 | 10K |
| R9 | 75K |
| R10 | 75K |
| C1 | 0.1 |
| C2 | 0.1 |
| C3 | 100 pF |
| C4 | 0.47 |
| C5 | 0.47 |
| C6 | 0.47 |
| C7 | 0.47 |
| D1 | 1N5806 |
| D2 | 1N5806 |
| D3 | 1N5806 |
| D4 | 1N5806 |
| D5 | 1N3595 |
| D6 | 1N3595 |
| D7 | 1N3595 |
| D8 | 1N3595 |
| D9 | 1N4460 (6.2 V) |
| D10 | 1N751A (5.1 V) |
| D11 | 1N758A (10 V) |
| D12 | 1N4148 |
| D13 | 1N4148 |
| D14 | 1N4148 |
| Q1, Q2 | IXYS IXGH10N60* |
| Q3 | 2N6849 |
| Q4 | 2N6796 |
| Q5 | 2N6849 |
| Q6 | 2N6796 |
| Q7 | 2N2222A |
| Q8 | 2N6849 |
| Q9 | 2N6782 |
| Q10 | 2N2907A |

*Example only - any power transistor of suitable design and power rating could be used.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

I claim:

1. A drive circuit for a power switching device, comprising:

a transformer having a primary winding and a secondary winding across which secondary pulses of first and second polarities and first and second magnitudes are developed when input pulses of opposing polarities are provided to the primary winding;

a full-wave rectifier bridge having first and second nodes coupled to the secondary winding and third and fourth nodes;

first and second capacitors connected in series between the third and fourth nodes;

first and second controlled switches coupled between a control electrode of the power switching device and the first and second capacitors, respectively, each controlled switch having a control electrode coupled to the secondary winding of the transformer;

wherein control current is drawn from the control electrode of the power switching device through the second controlled switch to the second capacitor in response to the development of a secondary pulse of the second polarity and the second magnitude, at which point charging current is provided to the first and second capacitors from the secondary winding of the transformer; and wherein the control current is provided by the first capacitor to the control electrode of the power switching device through the first controlled switch in response to the development of a secondary pulse of the first polarity and the first magnitude, the first capacitor being discharged thereby until a voltage magnitude of the first capacitor discharges below the first magnitude of the secondary pulse of the first polarity and the first magnitude, at which point charging current is provided to the first capacitor from the secondary winding of the transformer.

2. The drive circuit of claim 1, wherein a pulse is provided to the primary winding of the transformer at a particular time and further including means coupled to the first capacitor and operable before the particular time for precharging the first capacitor.

3. The drive circuit of claim 2, wherein the precharging means comprises a third controlled switch coupled between a voltage source and the first capacitor.

4. The drive circuit of claim 3, wherein the power switching device comprises a power transistor, wherein the power transistor includes a main current path electrode receiving a particular voltage developed by the voltage source and wherein the third controlled switch comprises a further transistor having first, second and third electrodes coupled to the main current path electrode of the power transistor, the first capacitor and the control electrodes of the first and second controlled switches, respectively.

5. The drive circuit of claim 4, further including first and second zener diodes coupled across the first and second capacitors, respectively, wherein the zener diodes limit first and second capacitor voltages appearing across the first and second capacitors to predetermined levels and wherein the second zener diode and the further transistor maintain the power transistor in an off state prior to the particular time.

6. The drive circuit of claim 5, further including a resistor coupled between the main current path electrode of the power transistor and the first electrode of the further transistor.

7. The drive circuit of claim 4, further including means coupled between the power transistor and the first electrode of the further transistor for detecting an overcurrent condition in the power transistor wherein the further transistor is responsive to such overcurrent detection to turn off the power transistor.

8. The drive circuit of claim 1, wherein each controlled switch includes first and second main current path electrodes wherein the first main current path electrodes of the first and second controllable switches are coupled to the first and second capacitors, respectively, and the second main current path electrodes are coupled through first and second resistors to the control electrode of the power switching device.

9. In a drive circuit for a power switching device wherein the drive circuit includes a transformer having a primary winding and a secondary winding across which a secondary pulse is developed when an input pulse is provided to the primary winding at a particular time, means coupled to the secondary winding for rectifying the secondary pulse, a capacitor connected across the rectifying means and a controlled switch having a control electrode coupled to the secondary winding of the transformer and first and second main current path electrodes, the first main current path electrode coupled to the capacitor and the second main current path electrode coupled to a control electrode of the power switching device, the improvement comprising:

means coupled to the first capacitor and operable before the particular time for precharging the capacitor.

10. The improvement of claim 9, wherein the precharging means comprises a further controlled switch coupled between a voltage source and the capacitor.

11. The improvement of claim 10, wherein the power switching device comprises a power transistor having first and second main current path electrodes wherein the first main current path electrode receives a particular voltage developed by the voltage source and wherein the further controlled switch comprises a further transistor having first, second and third electrodes coupled to the first main current path electrode of the power transistor, the capacitor and the control electrode of the first-named controlled switch, respectively.

12. The improvement of claim 11, further including a resistor coupled between the first main current path electrode of the power transistor and the first electrode of the further transistor.

13. The improvement of claim 11, further including means coupled between the power transistor and the first electrode of the further transistor for detecting an overcurrent condition in the power transistor wherein the further transistor is responsive to such overcurrent detection to turn off the power transistor.

14. In a drive circuit for a power transistor having main current path electrodes one of which is coupled to a power source wherein the drive circuit includes a pulse transformer having a primary winding and a secondary winding across which positive and negative secondary pulses are developed when positive and negative input pulses are provided to the primary winding following a particular time, means coupled to the secondary winding for rectifying the secondary pulses, first and second series-connected capacitors connected to the rectifying means and first and second controlled switches each having a control electrode coupled to the secondary winding of the transformer and main current path electrodes coupled between the capacitors and a control electrode of the power transistor, the improvement comprising:

means coupled to the first capacitor and operable before the particular time for precharging the first capacitor including a third controlled switch coupled between the power source and the first capacitor; and means coupled between the power transistor and the third controlled switch for detecting an overcurrent condition in the power transistor wherein the third controlled switch is responsive to such overcurrent detection to turn off the power transistor.

* * * * *